(12) United States Patent
Park et al.

(10) Patent No.: US 9,349,597 B2
(45) Date of Patent: May 24, 2016

(54) SEMICONDUCTOR MEMORY DEVICE AND METHOD OF MANUFACTURING THE SAME

(75) Inventors: Yong Dae Park, Seongnam-si (KR); Ga Hee Lee, Suwon-si (KR)

(73) Assignee: SK HYNIX INC., Icheon-si, Gyeonggi-do (KR)

( * ) Notice: Subject to any disclaimer, the term of this patent is extended or adjusted under 35 U.S.C. 154(b) by 0 days.

(21) Appl. No.: 13/613,653

(22) Filed: Sep. 13, 2012

(65) Prior Publication Data

US 2013/0161725 A1 Jun. 27, 2013

(30) Foreign Application Priority Data

Dec. 21, 2011 (KR) .................. 10-2011-0139050

(51) Int. Cl.
*H01L 29/792* (2006.01)
*H01L 21/265* (2006.01)
*H01L 27/115* (2006.01)

(52) U.S. Cl.
CPC .... *H01L 21/26586* (2013.01); *H01L 27/11582* (2013.01); *H01L 29/7926* (2013.01)

(58) Field of Classification Search
CPC ............... H01L 27/11582; H01L 21/26586; H01L 29/7926
See application file for complete search history.

(56) References Cited

U.S. PATENT DOCUMENTS

| | | | |
|---|---|---|---|
| 7,800,163 B2 * | 9/2010 | Izumi et al. | 257/324 |
| 7,902,023 B2 * | 3/2011 | Izumi et al. | 438/266 |
| 7,936,004 B2 * | 5/2011 | Kito et al. | 257/324 |
| 8,072,025 B2 * | 12/2011 | Nishihara et al. | 257/326 |
| 8,173,533 B2 * | 5/2012 | Kim et al. | 438/596 |
| 8,247,857 B2 * | 8/2012 | Ozawa et al. | 257/314 |
| 2010/0163968 A1 * | 7/2010 | Kim | H01L 27/11582 257/324 |
| 2011/0002178 A1 * | 1/2011 | Hwang | H01L 27/11578 365/189.011 |
| 2011/0141821 A1 * | 6/2011 | Izumi | H01L 27/115 365/185.23 |
| 2012/0070944 A1 * | 3/2012 | Kim et al. | 438/128 |
| 2012/0077320 A1 * | 3/2012 | Shim et al. | 438/269 |
| 2012/0156848 A1 * | 6/2012 | Yang | H01L 27/11529 438/287 |
| 2012/0273863 A1 * | 11/2012 | Ozawa et al. | 257/314 |
| 2012/0273865 A1 * | 11/2012 | Lee et al. | 257/316 |
| 2013/0009235 A1 * | 1/2013 | Yoo | 257/329 |
| 2013/0113101 A1 * | 5/2013 | Cheng et al. | 257/751 |

* cited by examiner

*Primary Examiner* — Victoria K Hall
(74) *Attorney, Agent, or Firm* — William Park & Associates Ltd.

(57) ABSTRACT

A semiconductor memory device includes conductive films and insulating layers alternately stacked on a substrate, substantially vertical channel layers penetrating the conductive films and the insulating layers, multilayer films including a charge storage film interposed between the conductive films and the substantially vertical channel layers, and a first anti-diffusion film formed on etched surfaces of the conductive films.

3 Claims, 15 Drawing Sheets

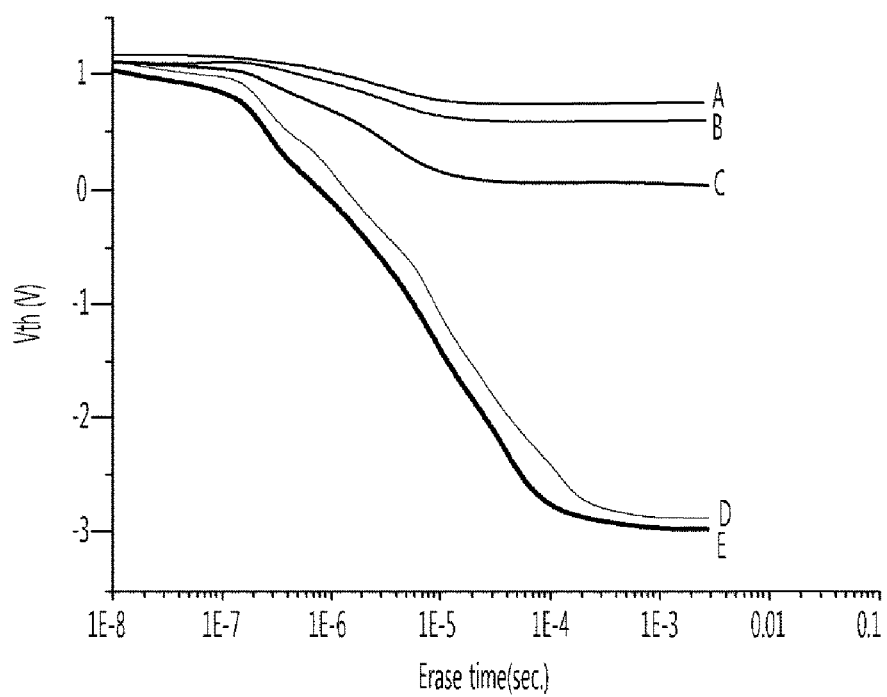

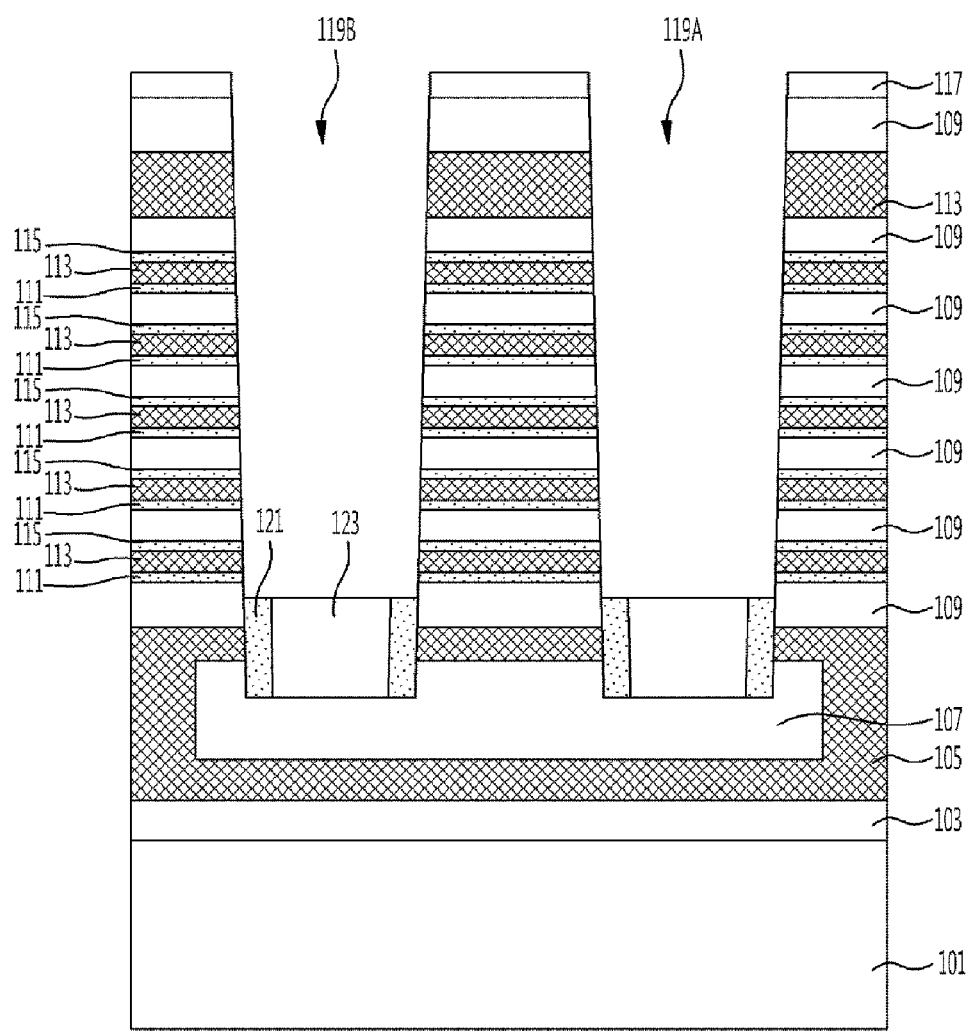

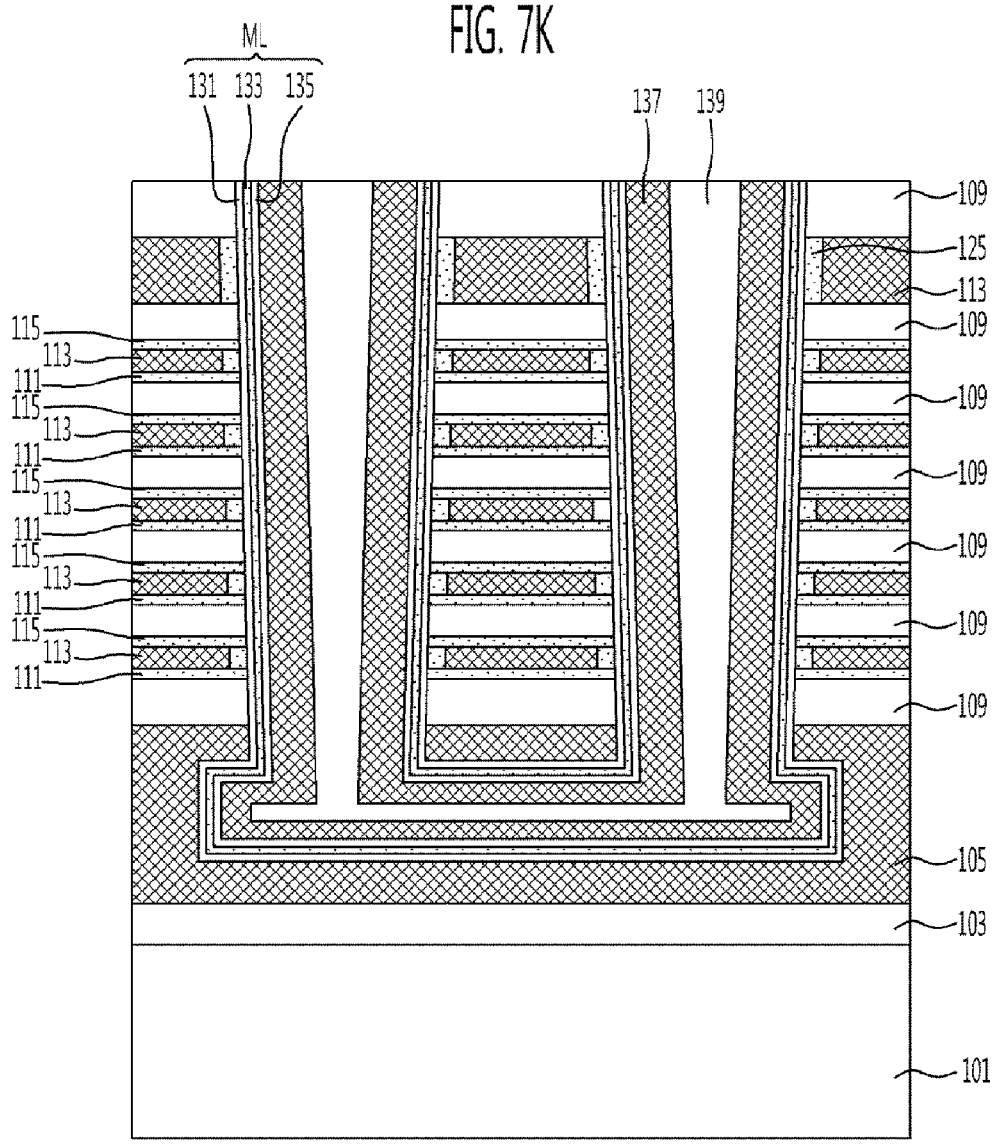

SEMICONDUCTOR MEMORY DEVICE AND METHOD OF MANUFACTURING THE SAME

CROSS-REFERENCE TO RELATED APPLICATION

Priority is claimed to Korean patent application number 10-2011-0139050 filed on Dec. 21, 2011, the entire disclosure of which is incorporated herein by reference in its entirety.

BACKGROUND

1. Technical Field

Various embodiments relate generally to a semiconductor memory device and a method for manufacturing the same, and to a semiconductor memory device adaptive to enhance operational characteristics and a method for manufacturing the same.

2. Related Art

In order to increase a degree of integration of a semiconductor memory device, a size of a memory cell is required to be reduced, but it is increasingly difficult to reduce the size. To this end, a semiconductor memory device having a three-dimensional (3D) structure in which memory cells are stacked has been developed. In particular, in case of a flash memory device, a memory array is formed to have various types of 3D structures.

As a memory array is formed to have a 3D structure, a voltage application scheme and an operating scheme, as well as operational characteristics, are changed. Thus, a manufacturing method and structure for preventing a degradation of operational characteristics is required.

BRIEF SUMMARY

Various embodiments relate to a semiconductor memory device and a method of manufacturing the same capable of enhancing operational characteristics.

A semiconductor memory device according to an embodiment includes: conductive films and insulating layers alternately stacked on a substrate; substantially vertical channel layers penetrating the conductive films and the insulating layers; multilayer films including a charge storage film interposed between the conductive films and the substantially vertical channel layers; and a first anti-diffusion film formed on etched surfaces of the conductive films.

An operating method of a semiconductor memory device according to an embodiment includes: alternately and repeatedly stacking first insulating layers and first conductive films on a substrate; forming a channel hole penetrating the first insulating layers and the first conductive films; doping impurities onto side walls of the first conductive films exposed through the channel hole; forming multilayer films including a charge storage film on inner walls of the channel hole; and forming a substantially vertical channel layer within the channel hole.

BRIEF DESCRIPTION OF THE DRAWINGS

FIG. 6 is a graph illustrating operational characteristics of a semiconductor memory device according to an embodiment;

FIGS. 7A to 7K are cross-sectional views illustrating a method for manufacturing a semiconductor memory device according to an embodiment.

DETAILED DESCRIPTION

Figure 1:
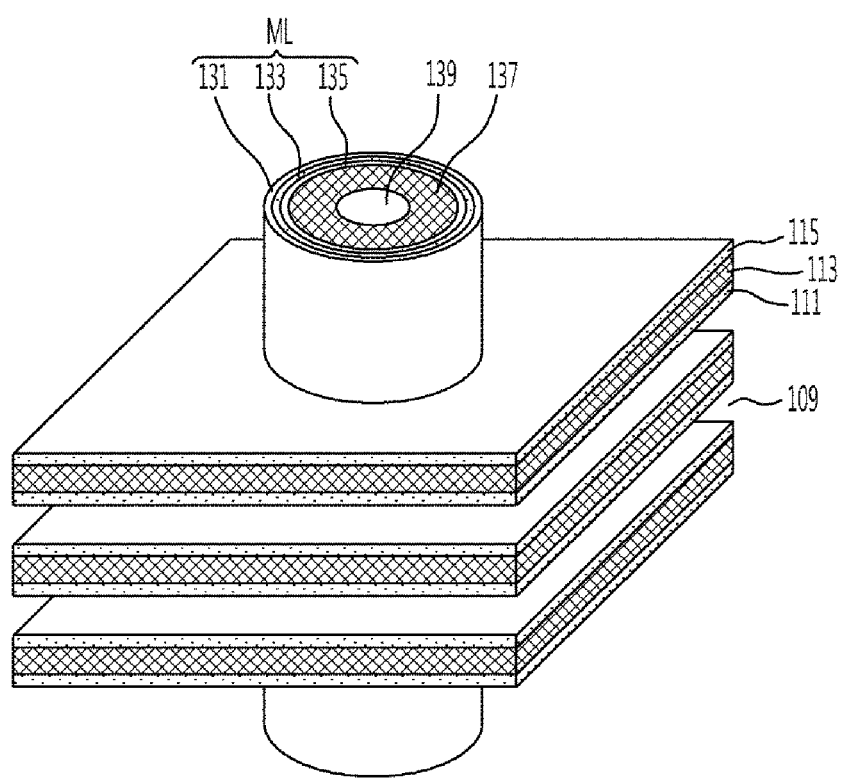
FIG. 1 is a perspective view of a semiconductor memory device according to an embodiment.

Hereinafter, various embodiments of the present disclosure will be described with reference to the accompanying drawings. The same reference numerals or the same reference designators may denote the same elements throughout the specification. However, the embodiments may be implemented in many different forms and should not be construed as being limited to the embodiments set forth herein. Rather, these embodiments are provided so that the disclosure will be thorough and complete, and will fully convey the scope of the invention to those skilled in the art and are defined by the claim coverage of the present invention.

Figure 2:
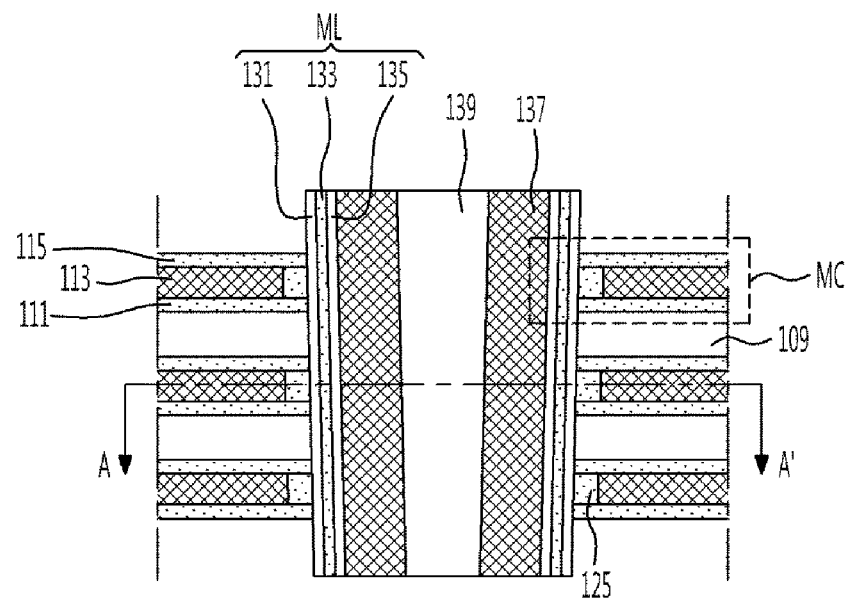
FIG. 2 is a cross-sectional view of the semiconductor memory device illustrated in FIG. 1.
Figure 3:
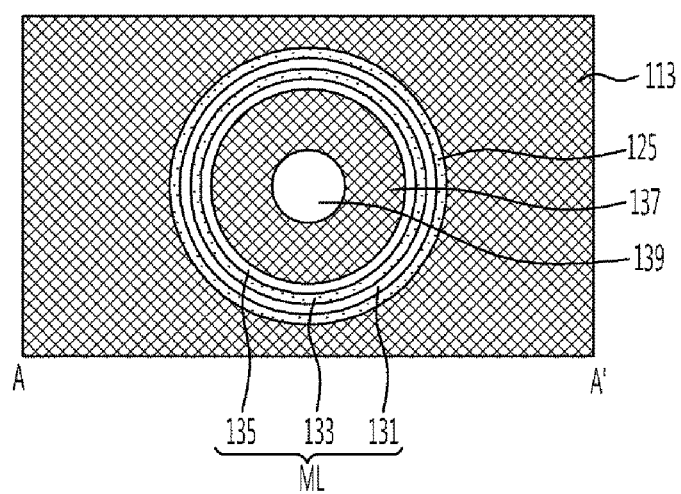
FIG. 3 is a plan view of the semiconductor memory device illustrated in FIG. 1.

FIG. 1 is perspective view of a semiconductor memory device according to an embodiment. FIG. 2 is a cross-sectional view of the semiconductor memory device illustrated in FIG. 1. FIG. 3 is a plan view of the semiconductor memory device illustrated in FIG. 1.

Referring to FIGS. 1 to 3, conductive films 113 and insulating layers 109 are alternately and repeatedly stacked on a substrate (not illustrated). The conductive films 113 may include a polysilicon film and may be formed as polysilicon films with P type impurities doped therein. The insulating layers 109 may be formed as oxide films.

A channel hole 119A (see FIG. 7C) penetrating the conductive film 113 and the insulating layer 109 may be formed. Multilayer films ML and a substantially vertical channel layer 137 may be formed within the channel hole 119A. Here, the multilayer films ML are interposed between the conductive films 113 and the vertical channel layer 137. Accordingly, the conductive films 113 may be disposed to substantially cover the multilayer films ML at different heights of the vertical channel layer 137.

The vertical channel layer 137 may be formed of a polysilicon film. The channel hole 119A may be filled by the substantially vertical channel layer 137. Also, the substantially vertical channel layer 137 may include an empty space at the center thereof, for example, a substantially cylindrical shape (or a substantially macaroni-like shape), and in this case, the internal empty space of the substantially vertical channel layer 137 may be filled with the insulating layer 139.

The multilayer films ML may include a charge storage film 133. Additionally, the multilayer films ML further may include a tunnel insulating layer 135 interposed between the charge storage film 133 and the substantially vertical channel layer 137 and a blocking insulating layer 131 interposed between the charge storage film 133 and the conductive film 113. The tunnel insulating layer 135 may be formed as an oxide film substantially covering outer walls of the substantially vertical channel layer 137. The charge storage film 133 may be formed as a nitride film substantially covering the tunnel insulating layer 135. The blocking insulating layer 131 may be formed to substantially cover the tunnel insulating layer 135 and may be formed as an oxide layer, or preferably, as a high-k insulating layer such as aluminum oxide film having a dielectric constant value higher than that of an oxide film.

In a bit-cost scalable (BiCS) structure or a pipe-shaped BiCS (P-BiCS) structure, the multilayer films ML may be formed on the entire inner walls of the channel hole 119A, so the substantially vertical channel layer 137 may be substantially covered by the multilayer films ML. The multilayer films ML may extend from between the vertical channel layer 137 and the conductive films 113 to between the vertical channel layer 137 and the insulating layers 109.

Additionally, electrical characteristics of the device may vary according to the concentration of impurities included in the conductive films 113. For example, when the concentration of impurities included in the conductive films 113 is low, an erasure speed is lowered. Namely, a threshold voltage of a memory cell MC is not readily lowered during an erase operation. The impurity concentration of the conductive films 113 may be lowered in etching the conductive film 113 to form the channel hole 119A, and may also be lowered by a follow-up cleaning process or thermal treatment process. In order to compensate this, impurities may be additionally injected (or doped) onto etching surfaces (inner walls) of the conductive films 113 exposed after the formation of the channel hole 119A to raise impurity concentration of the conductive film 113.

Also, in order to prevent impurities included in the conductive films 113 from being discharged to an outer side from etched surfaces (i.e., exposed inner walls), an anti-diffusion film 125 may be formed on the etched surfaces of the conductive films 113. In the BiCS structure or the P-BiCS structure, the conductive films 113 and the insulating layers 109 may be etched to form the channel hole 119A, inner walls of the conductive films 113 exposed through the channel holes 119A may make etched surfaces. The etched surfaces of the conductive films 113 substantially face the substantially vertical channel layer 137. Thus, the anti-diffusion film 125 may be interposed between the inner walls of the conductive films 113 substantially facing the substantially vertical channel layer 137 and the multilayer films ML.

Accordingly, the tunnel insulating layer 135, the charge storage film 133, the blocking insulating layer 131, and the anti-diffusion film 125 may be interposed between the substantially vertical channel layer 137 and the conductive films 113. If the anti-diffusion film 125 serves as a blocking insulating layer, the blocking insulating layer 131 may be omitted. In this case, the tunnel insulating layer 135, the charge storage film 133, and the anti-diffusion film 125 may be interposed between the substantially vertical channel layer 137 and the conductive film 113.

Additionally, when the conductive films 113 are etched to form the channel hole 119A, a great deal of loss of impurities is made at upper and lower corners of the conductive films 113. In order to prevent this, anti-diffusion films 111 and 115 (i.e., may be referred to as second anti-diffusion films) may be further formed on upper and lower portions of each of the conductive films 113. In this case, the anti-diffusion film 111 or 115 may be further interposed between every one of the conductive films 113 and the insulating layers 109.

The anti-diffusion films 111, 115, and 125 described herein may include a nitride film. Among them, the anti-diffusion film 111 may be formed as a nitride film through deposition, and the anti-diffusion films 115 and 125 may be formed by nitriding the conductive films 113.

The substantially vertical channel layer 137, the multilayer films ML, and the conductive films 113 as described above may constitute a memory cell MC, and the anti-diffusion film 125 may be further included in the memory cell MC.

Figure 4:
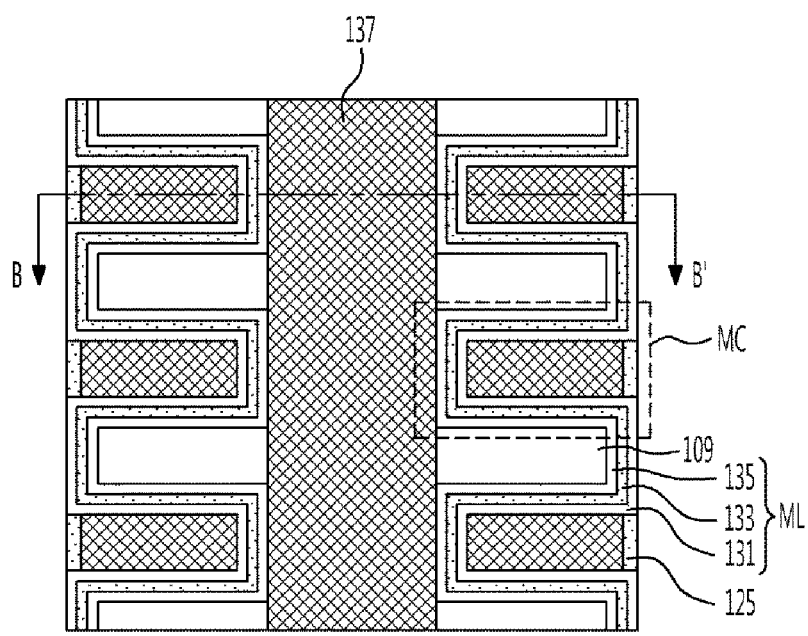
FIG. 4 is a cross-sectional view of a semiconductor memory device according to an embodiment.
Figure 5:
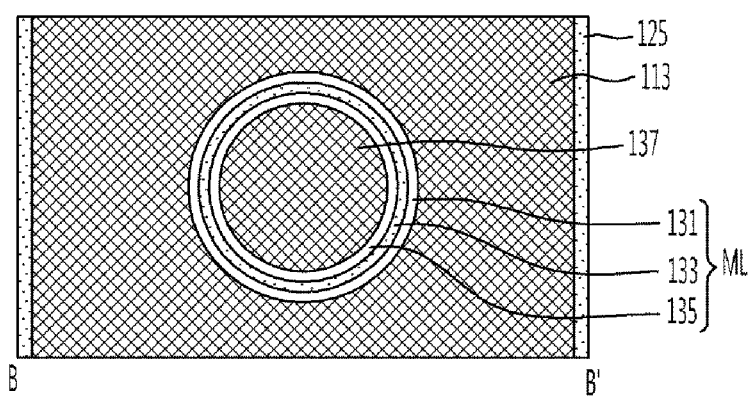
FIG. 5 is a plan view of the semiconductor memory device according to an embodiment.

FIG. 4 is a cross-sectional view of a semiconductor memory device according to an embodiment. FIG. 5 is a plan view of the semiconductor memory device according to an embodiment.

Referring to FIGS. 4 and 5, outer side walls of the conductive films 113 may be etched surfaces. The reason is as follows.

In a terabit cell array transistor (TCAT) structure, instead of a conductive film, a sacrificial film (not illustrated) such as a nitride film may be formed between the insulating layers 109, the insulating layers 109 and the sacrificial films may be etched to form a channel hole, and the substantially vertical channel layer 137 may be formed in the channel hole 119A. Subsequently, when an etching process is performed to pattern the insulating layers 109 and the sacrificial films, the insulating layers 109 and the sacrificial films remain separately on mutually different side walls of the mutually different substantially vertical channel layer 137. Subsequently, the sacrificial films between the insulating layers 109 may be removed, multilayer films ML including the charge storage film 133 may be formed on the side walls of the substantially vertical channel layer 137 and the surfaces of the insulating layers 109 may be exposed as the sacrificial films were removed, and spaces between the insulating layers 109 with the multilayer films ML formed thereon may be filled with the conductive films 113. Thereafter, an etching process may be performed on the conductive films 113 such that the conductive films 113 remain only between the insulating layers 109. In this manner, in the TCAT structure, the multilayer films ML extend from between the substantially vertical channel layer 137 and the conductive films 113 to between the conductive films 113 and the insulating layers 109. In detail, the multilayer films ML extend from between the substantially vertical channel layer 137 and the inner side walls of the conductive films 113, to outer side walls of the insulating layers 109 by way of spaces between the insulating layers 113 and the insulating layers 109.

Through the foregoing process, the outer side walls of the conductive films 113 make etched surfaces. With the outer side walls corresponding to the etched surfaces of the conductive films 113 exposed, impurities may be additionally injected (or doped) onto the exposed etched surfaces (outer side walls) of the conductive films 113 to increase the lowered impurity concentration of the conductive films 113. Also, in order to prevent impurities included in the conductive films 113 from being discharged to the outside from the etched surfaces (i.e., the exposed outer side walls), the anti-diffusion film 125 may be formed on the outer side walls of the conductive films 113. Also, an anti-diffusion film (not illustrated) may be further interposed between every one of the conductive films 113 and the insulating layers 109.

The substantially vertical channel layer 137, the multilayer films ML, and the conductive films 113 as described above constitute a memory cell MC, and the anti-diffusion film 125 formed on the outer side walls of the conductive films 113 may be further included in the memory cell MC.

FIG. 6 is a graph illustrating operational characteristics of a semiconductor memory device according to an embodiment.

Referring to FIG. 6, it can be seen that, when impurity concentration of a conductive film used as a word line or a control gate is low (A, B, and C), threshold voltages (i.e., Vth) were not lowered although an erase time was lengthened, but when the concentration of impurities included in the conductive film was high (D and E), threshold voltages were sufficiently lowered as the erase time was lengthened.

The impurity concentration of the conductive film may be lowered in a process of etching the conductive film, and in this case, the impurity concentration may be raised by doping impurities onto the etching surfaces of the conductive film after the etching process, thus preventing a degradation of operational characteristics. Also, in order to prevent impurities of the conductive film from being discharged from the etched surfaces of the conductive film during a follow-up cleaning process or thermal treatment process, an anti-diffusion film may be formed on the etched surfaces of the conductive film after impurity doping, thus preventing a degradation of operational characteristics.

Hereinafter, a method of manufacturing a semiconductor memory device as described above will be described.

FIGS. 7A to 7K are cross-sectional views illustrating a method for manufacturing a semiconductor memory device according to an embodiment. FIG. 8 is a sectional view illustrating a method for manufacturing a semiconductor memory device according to an embodiment as well.

Figure 7A:
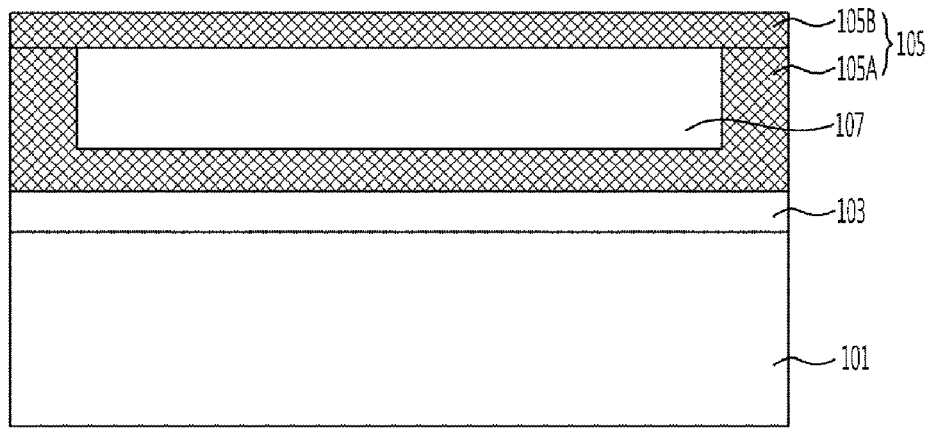
Figure 8:
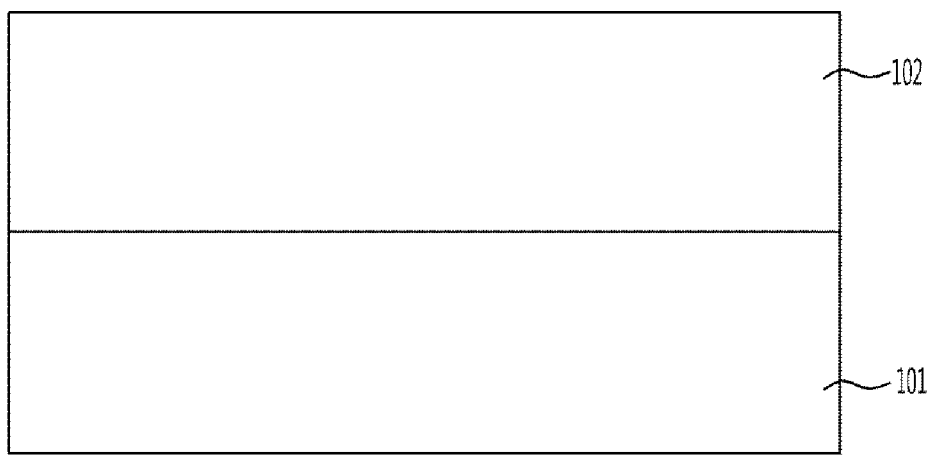
FIG. 8 is a sectional view illustrating a method for manufacturing a semiconductor memory device according to an embodiment.

Referring to FIG. 7A, in the case of the P-BiCS structure, an insulating layer 103 may be formed on a substrate 101, and a pipe gate 105 including a sacrificial film 107 may be formed on the insulating layer 103. Additionally, for example, a conductive film 105A may be formed on the insulating layer 103, and a partial region of the conductive film 105A may be etched to have a certain depth to form a trench in the conductive film 105A. The trench may be filled with the sacrificial film 107 such as a silicon nitride film 107 or a polysilicon film. Subsequently, a conductive film 105B may be formed on the sacrificial film 107 and the conductive film 105A. Here, the conductive films 105A and 105B may be formed as polysilicon films with impurities doped therein.

In the case of the BiCS structure, as illustrated in FIG. 8, a common source 102 may be formed on the substrate 101. The common source 102 may be formed by injecting second type (e.g., an N type) of impurities different from first type (e.g., a P type) of impurities included in the substrate, or may be formed by depositing a polysilicon film including the second type of impurities. Meanwhile, in the case of the TCAT structure, the process described above with reference to FIG. 7B may be performed without forming a pipe gate or a common source.

Transistors for forming peripheral circuits may be fabricated in neighbor regions while the foregoing process is performed or before or after the process.

Hereinafter a process of fabricating a semiconductor memory device having a P-BiCS structure will be described as an example.

Figure 7B:
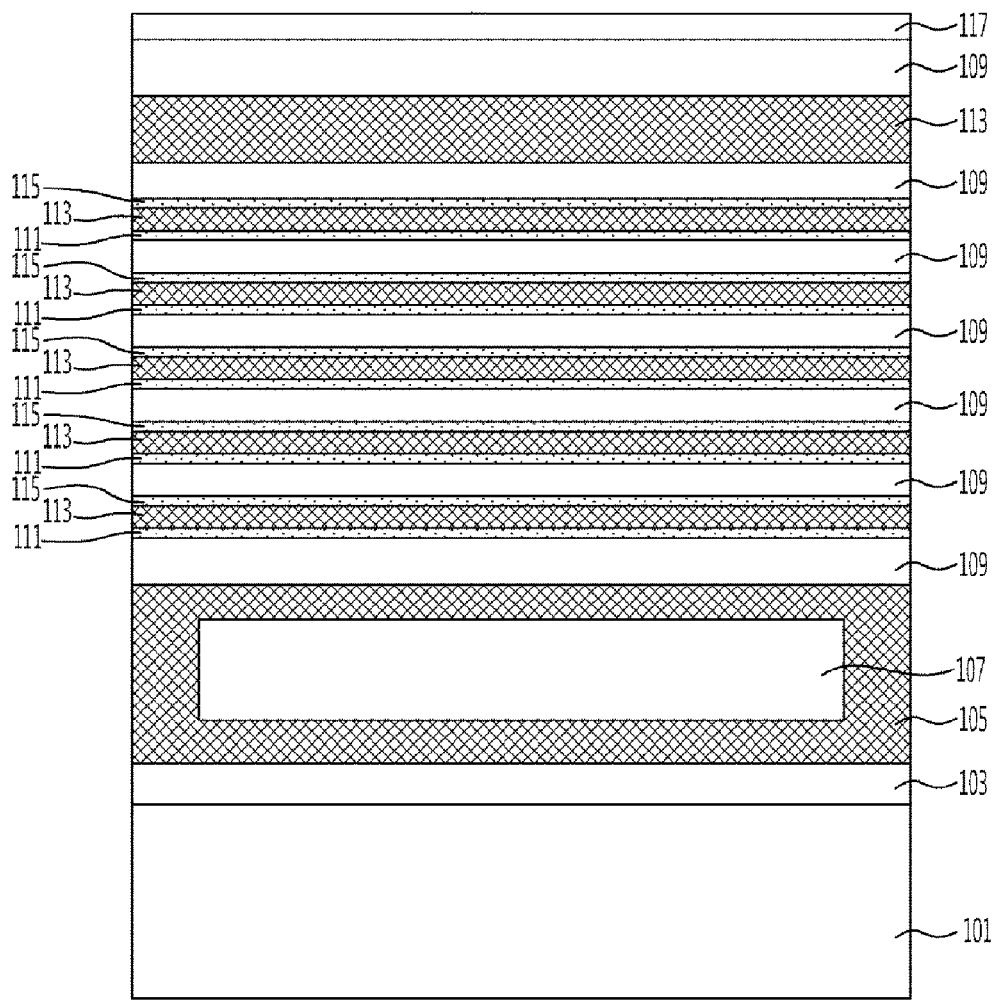

Referring to FIG. 7B, insulating layers 109 and conductive films 113 may be alternately and repeatedly formed on the substrate 101 with a structure including a pipe gate formed thereon. Here, the insulating layers 109 may be formed as silicon oxide films and used as insulating layers between cell gates. The conductive films 113 may be formed as polysilicon films including P type impurities and used as control gates or word lines. The number of stacked conductive films 113 may correspond to the number of memory cells connected in series in a memory string.

For reference, preferably, the insulating layer 109 may be formed as the lowermost layer and the uppermost layer in the stacked structure of the conductive films 113. Also, the insulating layers 109 of the lowermost layer and the uppermost layer may be formed to be thicker than the insulating layers 109 formed between the conductive films 113. The uppermost conductive film among the conductive films 113 may be used as a gate of a select transistor, so it may be formed to be thicker than the other conductive films. In the BiCS structure or the TCAT structure, the lowermost conductive film may also be used as a gate of the select transistor, so it may also be formed to be thicker.

Additionally, anti-diffusion films 111 and 115 may be further formed between the conductive films 113 and the insulating layers 109. Namely, the anti-diffusion films 111 and 115 may be further formed on upper and lower portions of the respective conductive films 113, and here, the anti-diffusion films 111 and 115 may be formed as nitride films. The lower anti-diffusion film 111 may be formed through deposition, and the upper anti-diffusion film 115 may be formed through deposition or by nitriding an upper surface of each of the conductive films 113. The anti-diffusion films 111 and 115 may be formed to protect upper and lower corners of the conductive films 113 in a follow-up process of etching the conductive films 113, to the prevent impurities of the conductive films 113 from being discharged to the outside from the upper and lower corners.

Figure 7C:
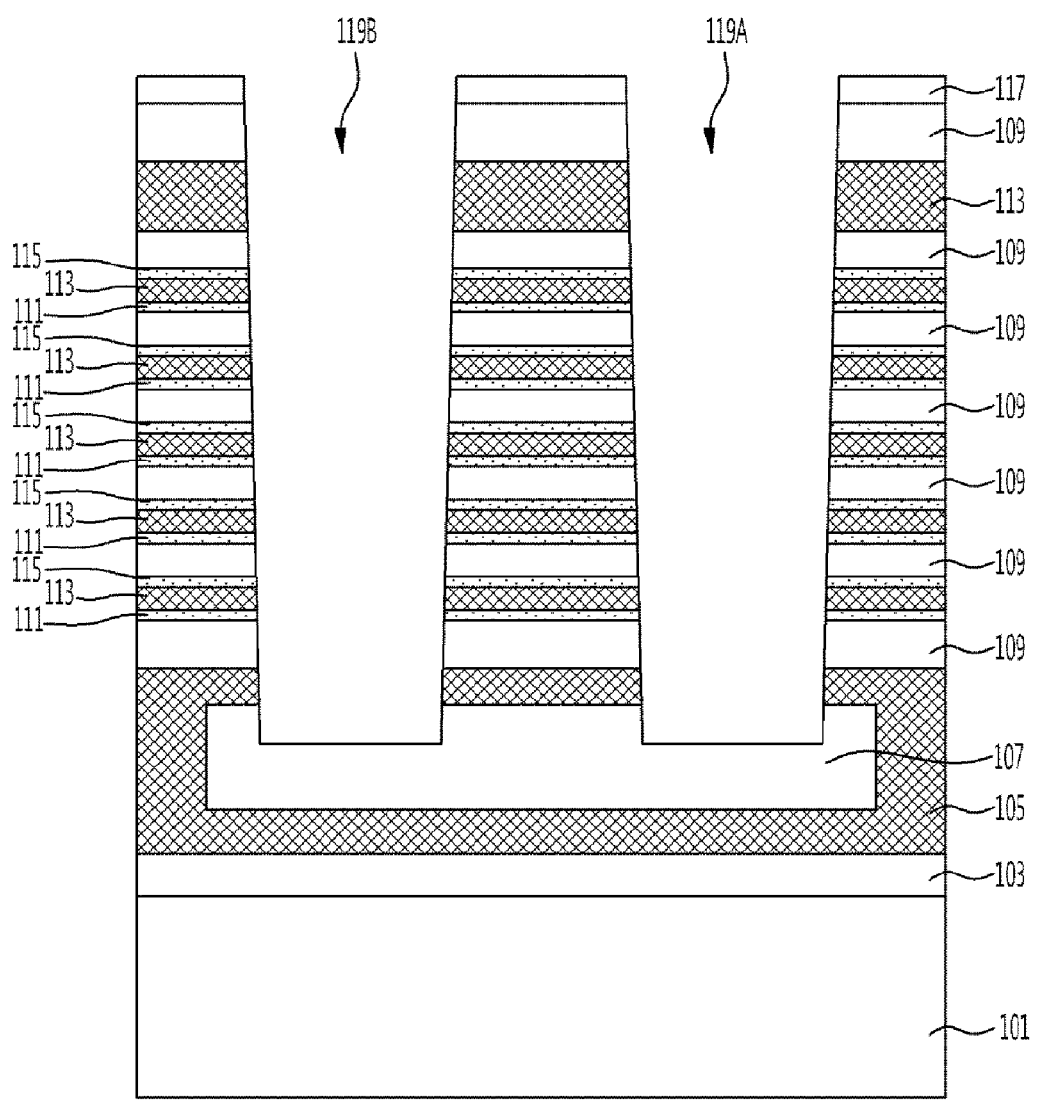

Referring to FIG. 7C, a hard mask may be patterned to form a hard mask pattern 117 (see also FIG. 7B) exposing a region in which a channel hole is to be formed, and stacked structures 109, 111, 113, and 115 may be etched through an etching process using the hard mask pattern 117 as an etching mask. Accordingly, two channel holes 119A and 119B may be formed in every single memory string. In forming the channel holes 119A and 119B, preferably, etching may be performed on and up to an upper portion of the pipe gate 105 such that the sacrificial film 107 within the pipe gate 105 is exposed. Ideally, the side walls of the channel holes 119A and 119B are perpendicular or substantially perpendicular to the substrate 101, but in terms of process characteristics, the channel holes 119A and 119B may be formed such that the side walls thereof are less sloped than being perpendicular.

As the channel holes 119A and 119B are formed, inner side walls (etched surfaces) of the conductive films 113 may be exposed from the side walls of the channel holes 119A and 119B and the sacrificial film 107 may be exposed from the bottoms of the channel holes 119A and 119B. The side walls of the conductive films 113 may also be exposed slopingly. Additionally, in the process of etching the conductive films 113 to form the channel holes 119A and 119B, impurities included in the conductive films 113 may be discharged to lower impurity concentration of the conductive films 113. Thus, processes may be performed to compensate for it.

Additionally, when impurities are doped into the pipe gate 105 in the process of doping impurities into the conductive films 113, impurity concentration of the pipe gate 105 may be further increased to cause a voltage breakdown problem. Thus, in order to complement for this problem, preferably, an anti-doping film is formed on the bottoms of the channel holes 119A and 119B and doping impurities into the conductive films 113 may be subsequently performed. This will be described in below as follows.

Figure 7D:
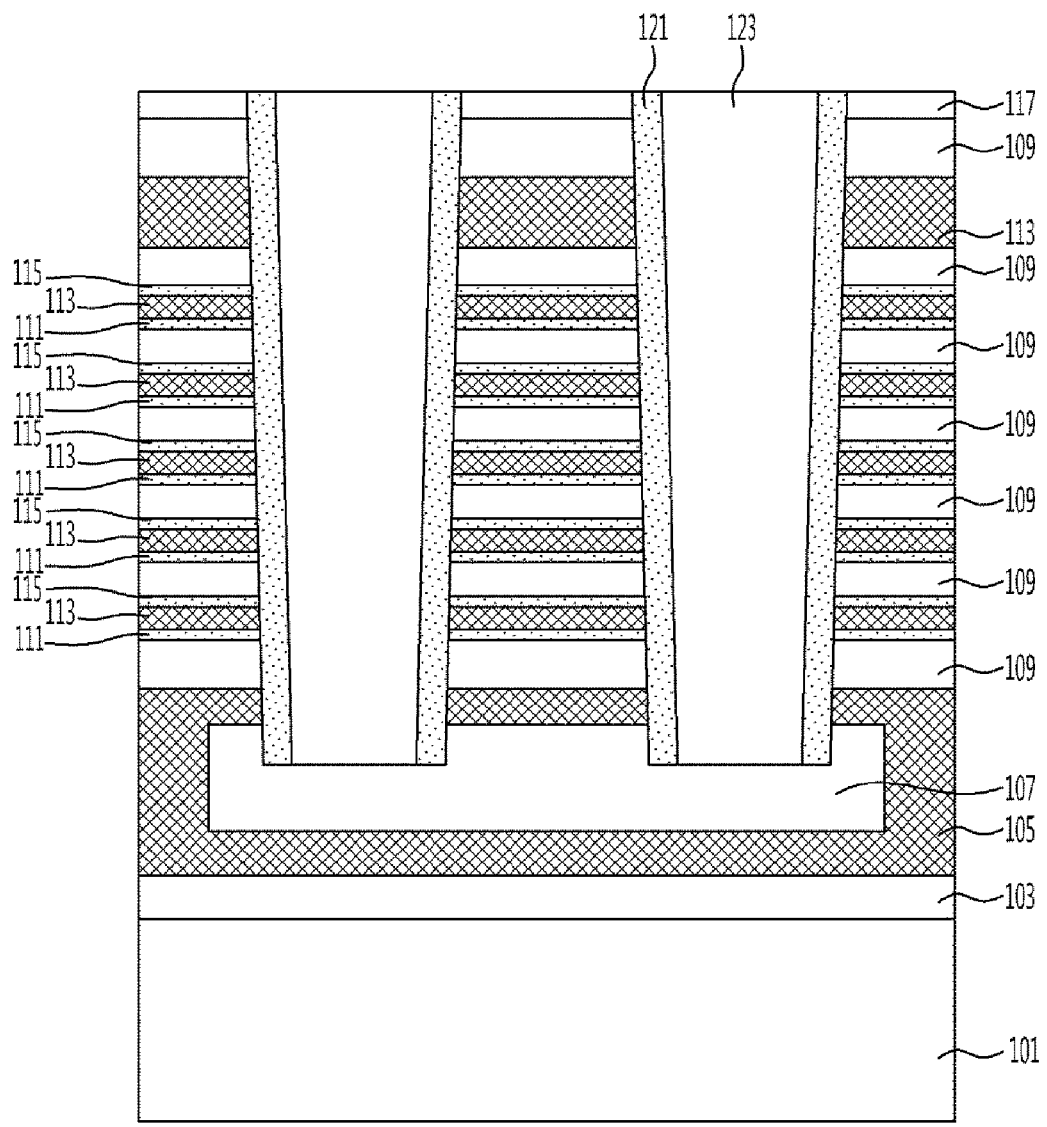

Referring to FIG. 7D, anti-etching films 121 may be formed on side walls of the channel holes 119A and 119B and the channel holes 119A and 119B may be filled with insulating layers 123. The anti-etching films 121 may be formed as nitride films, and the insulating layer 123 may be formed as oxide films.

Referring to FIG. 7E, upper portions of the insulating layers 123 may be etched such that the insulating layers 123 remain only on the bottoms of the channel holes 119A and 119B. Here, the insulating layers 109 between the conductive films 113 may be protected by the anti-etching films 121 and thus not etched. Subsequently, upper portions of the anti-etching films 121 may also be etched such that the anti-etching films 121 remain only on the bottoms of the channel holes 119A and 119B. Here, exposed portions of the anti-etching films 121 may be removed, and the anti-etching films 121 may remain as high as the insulating layers 123. Also, in order to expose side walls of the conductive films 113 and prevent the pipe gate 105 from being exposed, preferably, the anti-etching films 121 and the insulating layers 123 remain by only the height corresponding to a middle portion of the lowermost insulating layer 109 among the insulating layers 109. Accordingly, the anti-doping films 121 may be formed on the bottoms of the channel holes 119A and 119B and the pipe gate 105 may not be exposed.

Figure 7F:
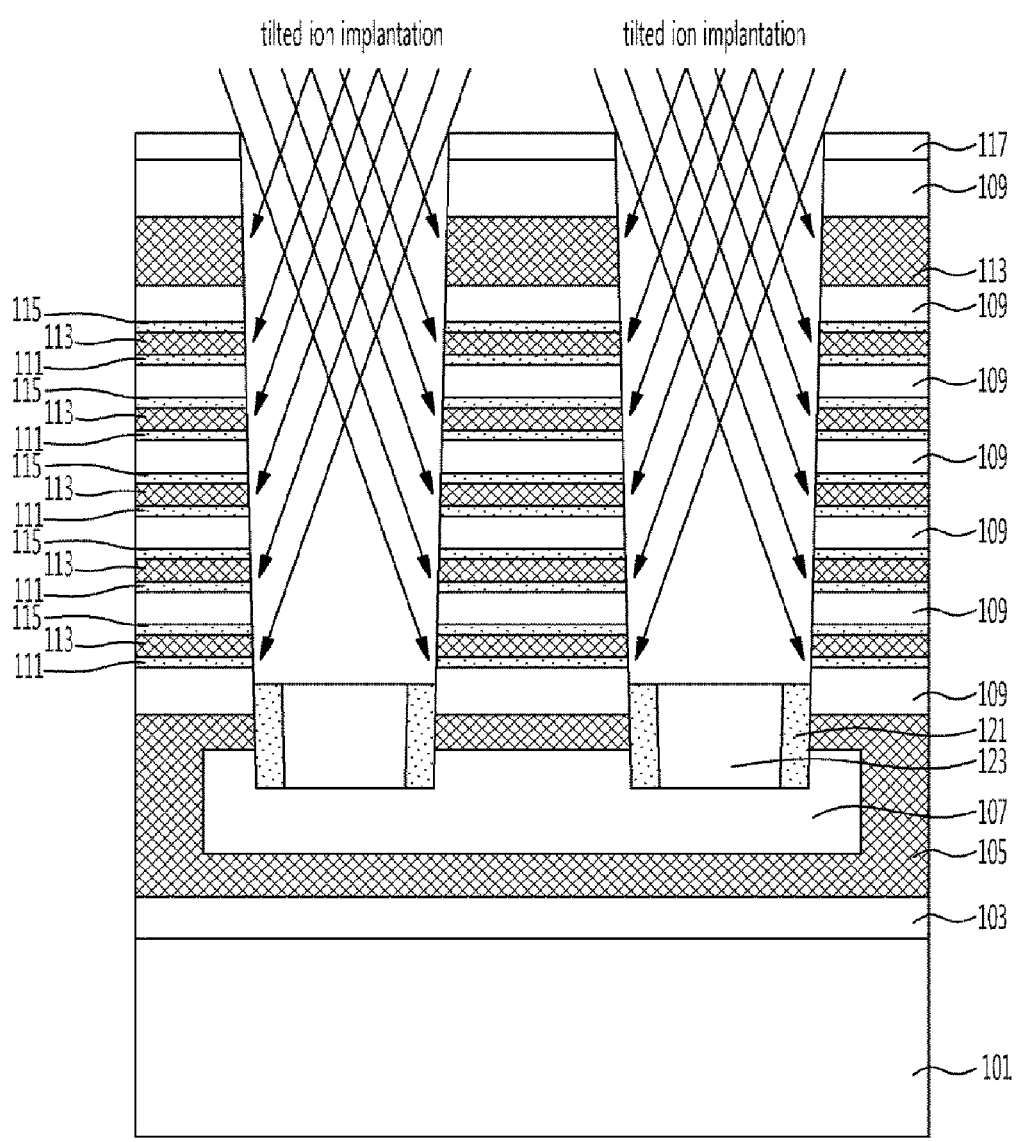

Referring to FIG. 7F, in order to supplement impurities of the conductive films 113 discharged through the side walls of the conductive films 113 exposed, as the channel holes 119A and 119B are formed, a process of doping impurities onto the side walls of the conductive films 113 exposed through the channel holes 119A and 119B may be performed. Here, the same type of impurities (e.g., boron) as the type (e.g., P type) of impurities included in the conductive films 113 may be doped.

Impurity doping may be performed through tilted ion implantation. Also, impurities may be diffused into the conductive films 113 through the exposed inner side walls (etched surfaces) of the conductive films 113 by supplying a gas including P type impurities, thus creating impurities. Accordingly, impurity injected regions may be formed on exposed edge regions of the conductive films 113, and thus, impurity concentration of the conductive films 113 may be raised to reach a target concentration or higher.

Figure 7G:
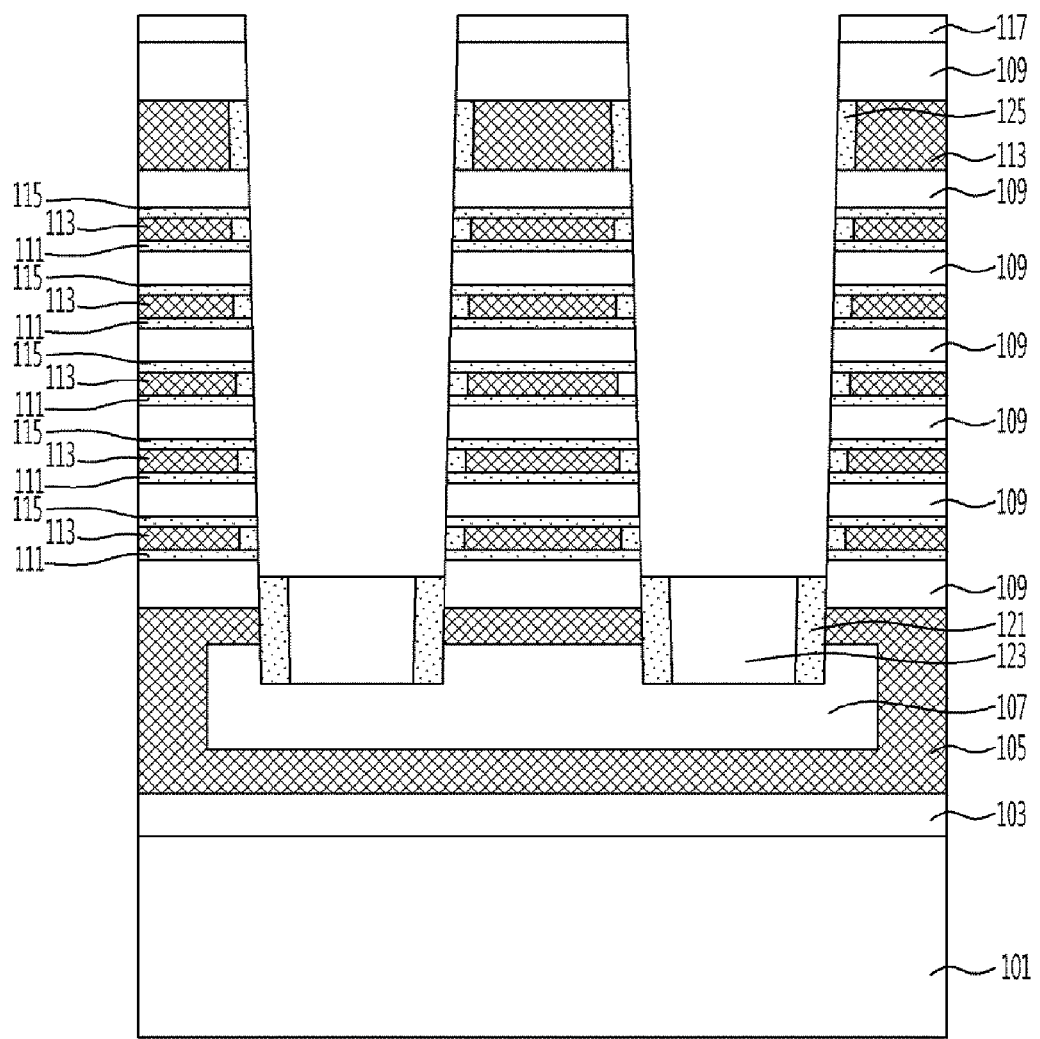

Referring to FIG. 7G, anti-diffusion films 125 may be formed on the exposed side walls of the conductive films 113. The anti-diffusion films 125 may be made of nitride films and may be selectively formed only on the exposed side walls of the conductive films 113 through a nitriding process.

As the anti-diffusion films 125 are formed on the exposed side walls of the conductive films 113, all the surfaces of the conductive films 113 may be substantially surrounded by the anti-diffusion films 111, 115, and 125. As a result, although a follow-up cleaning process or thermal treatment process may be performed, impurities included in the conductive films 113 can be prevented from being discharged to the outside, and thus, impurity concentration of the conductive films 113 may not be lowered.

Thereafter, processes for removing the anti-doping films and the sacrificial film may be performed.

Figure 7H:
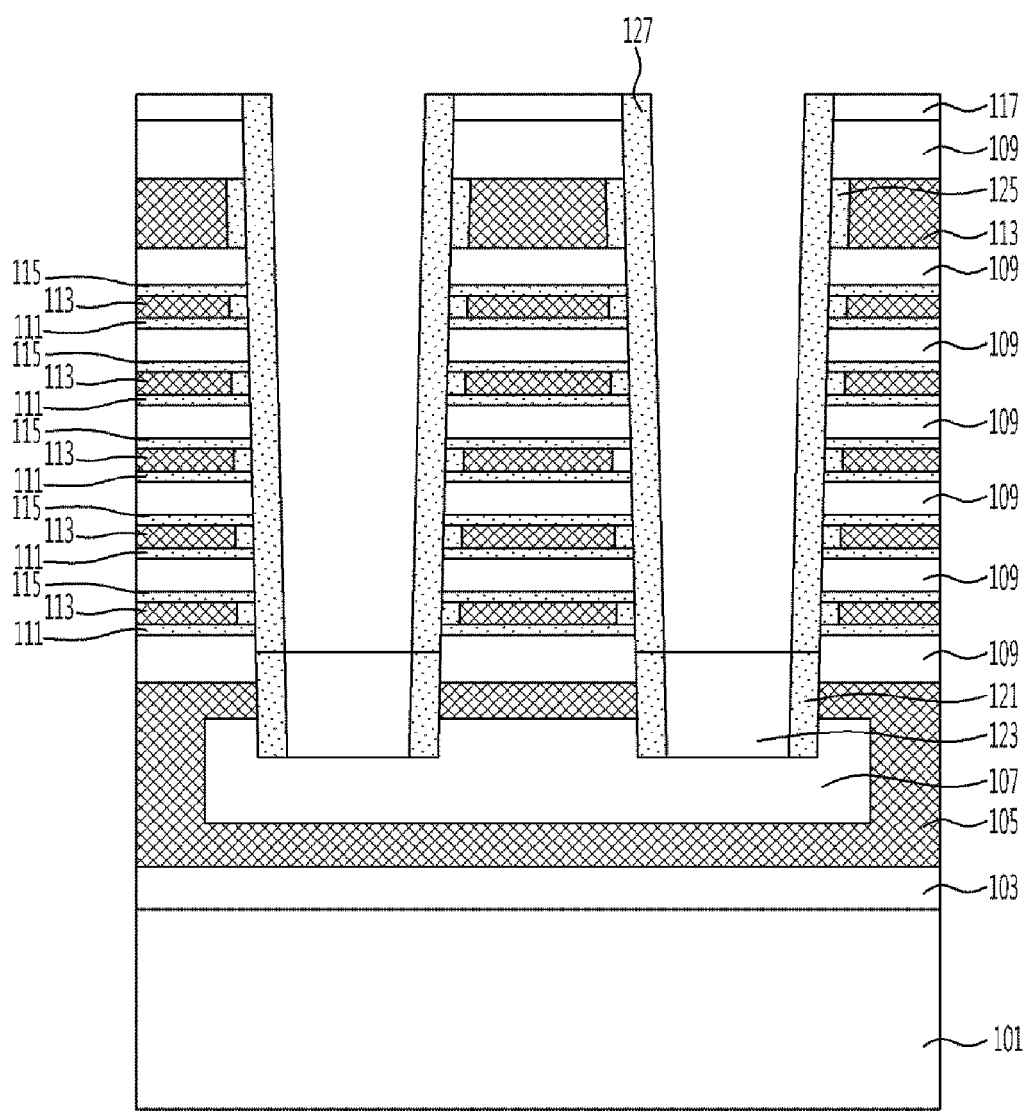

Referring to FIG. 7H, anti-etching films 127 may be formed on the side walls of the channel holes 119A and 119B. The anti-etching films 127 may be formed as nitride films.

Figure 7I:
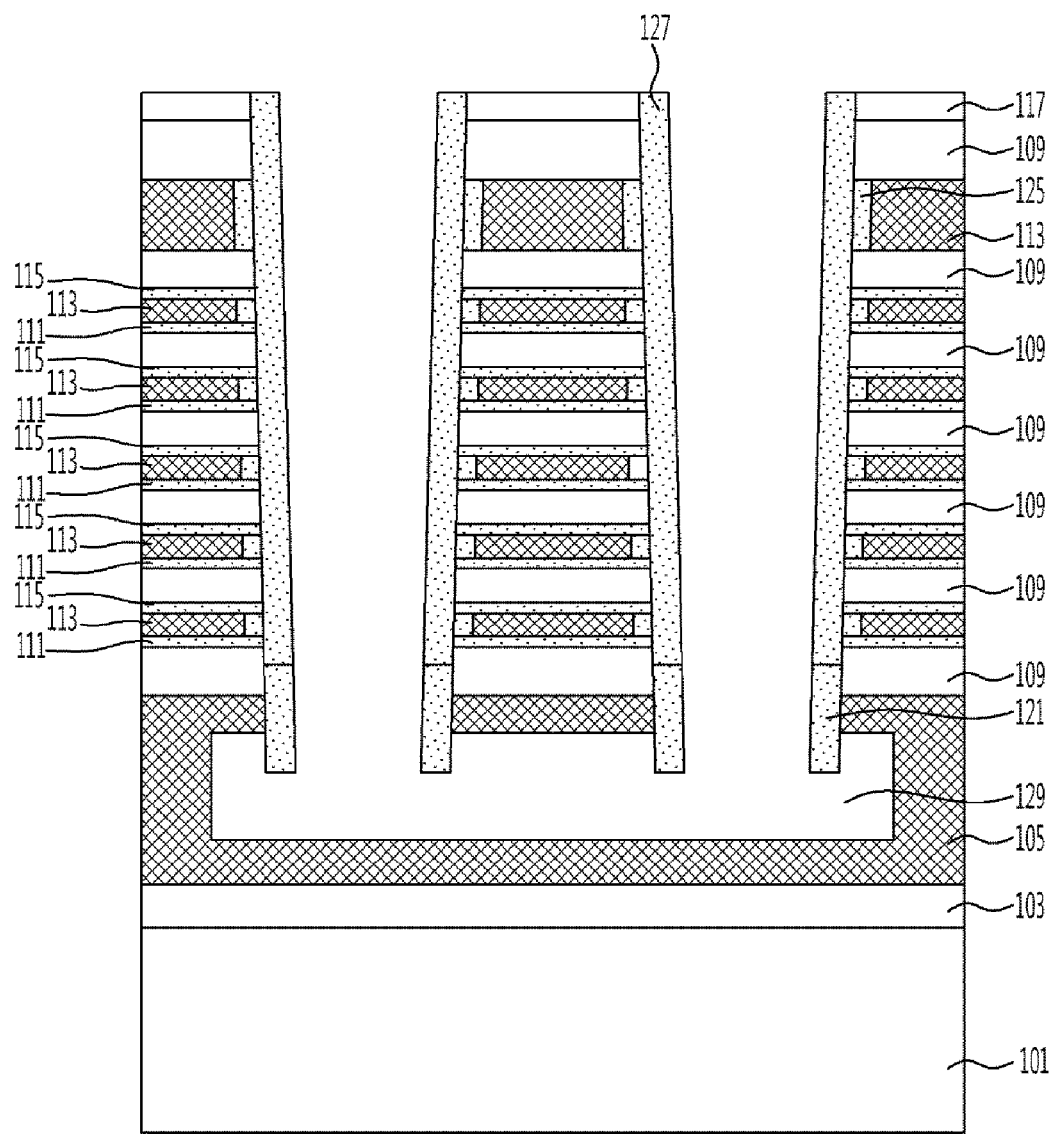

Referring to FIG. 7I, the insulating layers 123 remaining on the bottoms of the channel holes 119A and 119B and the sacrificial film 107 within the pipe gate 105 may be removed. When the insulating layers 123 and the sacrificial film 107 are removed, the insulating layers 109 between the conductive films 113 may be protected by the anti-etching films 127.

As the insulating layers 123 and the sacrificial film 107 are removed, a substantially horizontal space 129 may be formed and connected to the channel holes 119A and 119B in substantially the vertical direction.

Figure 7J:
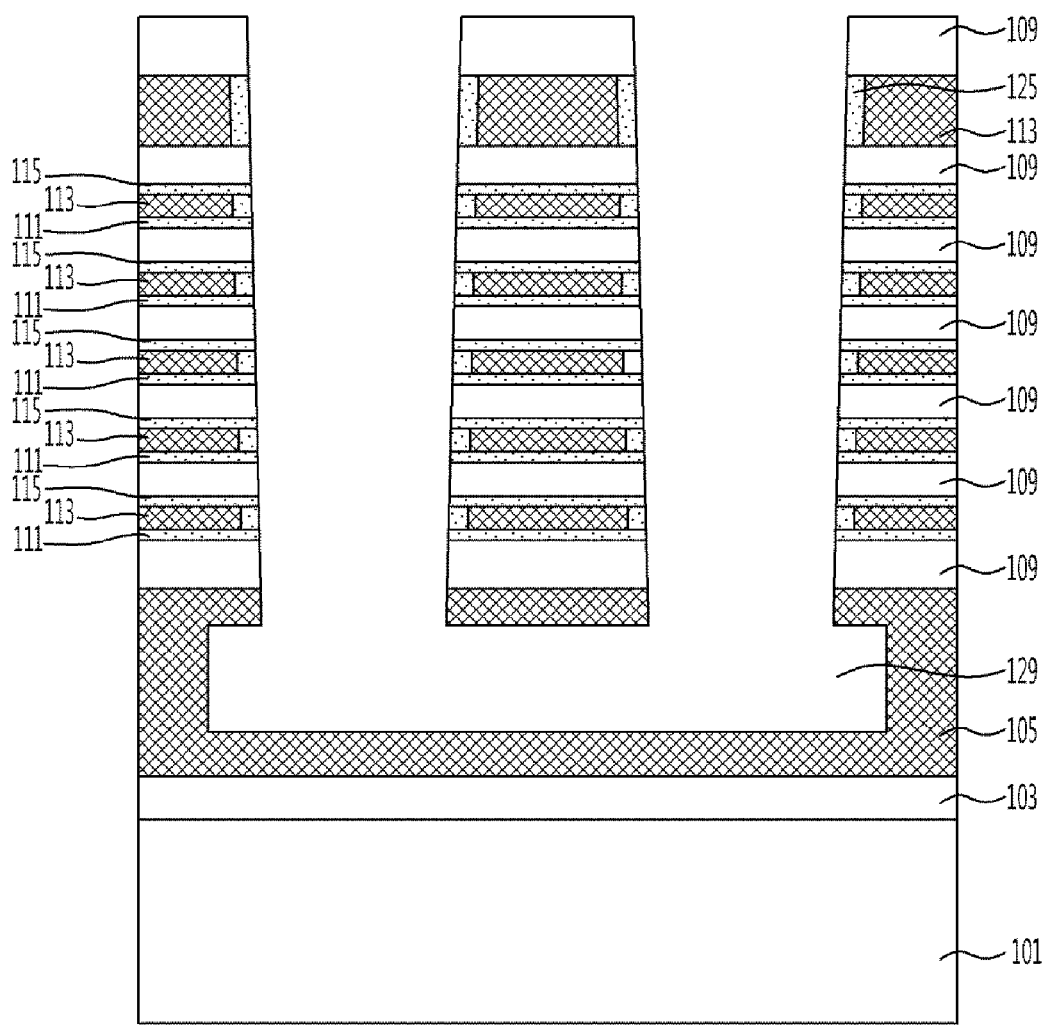

Referring to FIG. 7J, the anti-etching films 121 and 127 and hard mask 117 are removed.

Referring to FIG. 7K, the multilayer films ML including the charge storage film 133 may be formed on inner walls of the pipe gate 105 and the channel holes 119A and 119B. The multilayer films ML may include the tunnel insulating layer 135, the charge storage film 133, and the blocking insulating layer 131. The blocking insulating layer 131 may be formed on the inner walls of the substantially horizontal space 129 within the pipe gate 105 and the channel holes 119A and 119B, and may be formed as a high-k insulating layer such as an aluminum oxide film having a dielectric constant value higher than that of a silicon oxide film or nitride film. The charge storage film 133 may be formed on a surface of the blocking insulating layer 131 and may be formed as a nitride film. The tunnel insulating layer 135 may be formed on a surface of the charge storage film 133 and may be formed as a silicon oxide film.

Subsequently, the channel layers 137 may be formed in the channel holes 119A and 119B and the substantially horizontal space within the pipe gate 105. The channel layers 137 may include substantially vertical channel layers formed within the channel holes 119A and 119B, respectively, and a substantially horizontal channel layer formed in the substantially horizontal space 129. In the BiCS structure or the TACT structure, such a pipe gate 105 or such a substantially horizontal space 129 in the pipe gate 105 does not exist, so the substantially vertical channel layers 137 may be formed only within the channel holes 119A and 119B.

Additionally, the channel layers 137 may be formed to fill the entirety of the channel holes 119A and 119B and the substantially horizontal space 129. Also, when the channel layers 137 are formed on the multilayer films ML, the channel layers 137 may be formed such that they do not fully fill the channel holes 119A and 119B and the substantially horizontal space 129. In this case, the channel layers 137 may be formed to have a substantially hollow cylindrical shape (or a macaroni-like shape), and the inner space (i.e., the remaining space of the channel holes and the horizontal space) of the channel layers 137 may be filled with the insulating layers 139.

Thereafter, although not illustrated, the stacked structures 109, 111, 113, and 115 are etched to form a slit, and select lines may be defined according to a conventional technique. Also, bit lines and a common source line may be formed to be connected to the substantially vertical channel layers 137.

Through the foregoing processes, impurities are additionally doped onto the conductive films 113 and the doped impurities may be prevented from being discharged from the conductive films 113 by using the anti-diffusion films 111, 115, and 125, whereby electrical characteristics of the semiconductor memory device can be enhanced.

Thus, according to embodiments of the present invention, operating characteristics of the semiconductor memory device can be enhanced.

What is claimed is:
1. A semiconductor memory device comprising:
conductive films and insulating layers alternately stacked on a substrate;
a substantially vertical channel layer penetrating the conductive films and the insulating layers;
a multilayer film including a tunnel insulating layer, a charge storage film and a blocking insulating layer, the multilayer film surrounding upper surfaces, lower surfaces, and inner side walls of the conductive films, wherein the conductive films include a polysilicon film having P type impurities doped therein; and
first anti-diffusion films, each anti-diffusion film formed along an outer wall of each conductive film opposite to the inner side wall of the conductive film, wherein the first anti-diffusion films prevent impurities included in the conductive films from being discharged outside from the outer side walls of the conductive films, wherein each of the first anti-diffusion films includes a nitride film formed through deposition or by nitriding the conductive films.

2. The semiconductor memory device of claim 1, wherein the upper surfaces, the lower surfaces and the inner side walls of the conductive films contact the multilayer film.

3. The semiconductor memory device of claim 1, wherein the blocking insulating layer surrounds the upper surfaces, the lower surfaces and the inner side walls of the conductive films, the charge storage film surrounds the blocking insulating layer, and the tunnel insulating layer surrounds the charge storage film.

\* \* \* \* \*